United States Patent
Jiang

(12) 
(10) Patent No.: US 6,586,334 B2
(45) Date of Patent: Jul. 1, 2003

(54) REDUCING COPPER LINE RESISTIVITY BY SMOOTHING TRENCH AND VIA SIDEWALLS

(75) Inventor: Qing-Tang Jiang, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/975,571

(22) Filed: Oct. 11, 2001

(65) Prior Publication Data

US 2002/0055256 A1 May 9, 2002

Related U.S. Application Data

(60) Provisional application No. 60/247,650, filed on Nov. 9, 2000.

(51) Int. Cl.[7] .............................................. H01L 21/44
(52) U.S. Cl. ...................... 438/687; 438/627; 438/637; 438/638
(58) Field of Search ................................ 438/627, 637, 438/638, 687

(56) References Cited

U.S. PATENT DOCUMENTS

| | | | | |
|---|---|---|---|---|
| 6,217,721 | B1 | * 4/2001 | Xu et al. | 204/192.17 |
| 6,319,822 | B1 | * 11/2001 | Chen et al. | 438/637 |
| 6,326,297 | B1 | * 12/2001 | Vijayendran | 438/627 |
| 6,380,628 | B2 | * 4/2002 | Miller et al. | 257/762 |
| 2001/0019884 | A1 | * 9/2001 | Miller et al. | 438/633 |

\* cited by examiner

Primary Examiner—John F. Niebling
Assistant Examiner—Lynne A. Gurley
(74) Attorney, Agent, or Firm—Jacqueline J. Garner; W. James Brady, III; Frederick J. Telecky, Jr.

(57) ABSTRACT

A method of fabricating an integrated circuit. A thin liner (110, 210, 310) is deposited over dielectric layer including within a trench (108) and/or via (106). The thin liner (110, 210, 310) smoothes the sidewalls of the trench (108) and/or via (106) and reduces resistivity. The thin liner may comprise an organic or inorganic dielectric (110) or metal (210,310). A copper interconnect structure (116, 216, 316) is then formed over the thin liner (110, 210, 310).

11 Claims, 4 Drawing Sheets

REDUCING COPPER LINE RESISTIVITY BY SMOOTHING TRENCH AND VIA SIDEWALLS

This application claims priority under 35 USC § 119(e)(1) of provisional application Nos. 60/247,650 filed Nov. 09, 2000.

FIELD OF THE INVENTION

The invention is generally related to the field of fabricating copper interconnects in semiconductor devices and more specifically to a reducing copper line resistivity.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects due to the significantly lowered resistivity of copper versus aluminum. The resistivity of copper is less than 1.8 $\mu\Omega$-cm for copper lines wider than 0.5 $\mu$m in linewidth. However, the value increases rapidly as the copper line/via dimension decreases. At 0.20 $\mu$m linewidth, the copper line resistivity was measured to be 2.15 $\mu\Omega$-cm. The increase in copper resistivity is expected to accelerate as the dimension continues to shrink. Simulations indicate that the copper resistivity will surpass aluminum resistivity of 2.8 $\mu\Omega$-cm at the 0.08 $\mu$m technology. FIG. 1 displays the simulation results that show how quickly the resistivity rises as linewidth decreases using current copper interconnect approaches.

SUMMARY OF THE INVENTION

The invention reduces copper line resistivity by smoothing trench and via sidewalls. After the via and/or trench etches, the rough sidewalls are smoothed by depositing a thin layer of liner material. If desired, a directional etch may follow the deposition to remove liner material from the horizontal surfaces. Processing continues to form the copper interconnect with any desired barrier layers.

An advantage of the invention is providing a copper interconnect with reduced line resistivity for deep sub-quarter micron devices.

This and other advantages will be apparent to those of ordinary skill in the art having reference to the specification in conjunction with the drawings.

DETAILED DESCRIPTION OF THE EMBODIMENTS

Figure 1:
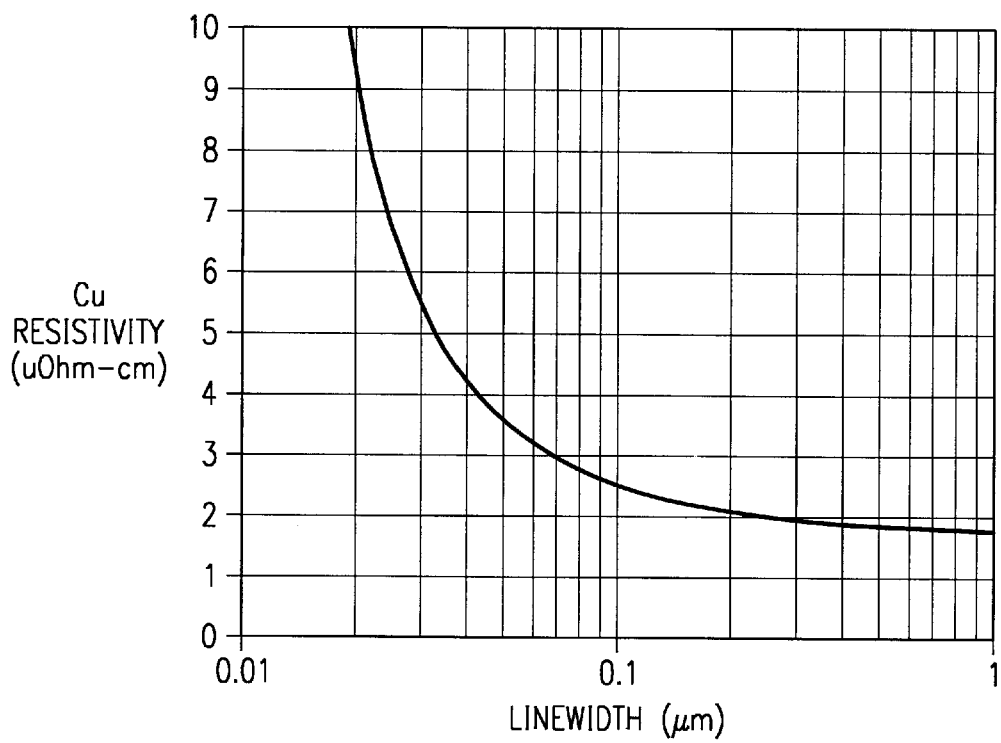
FIG. 1 is a graph of a theoretical prediction of resistivity versus copper linewidth.
Figure 2:
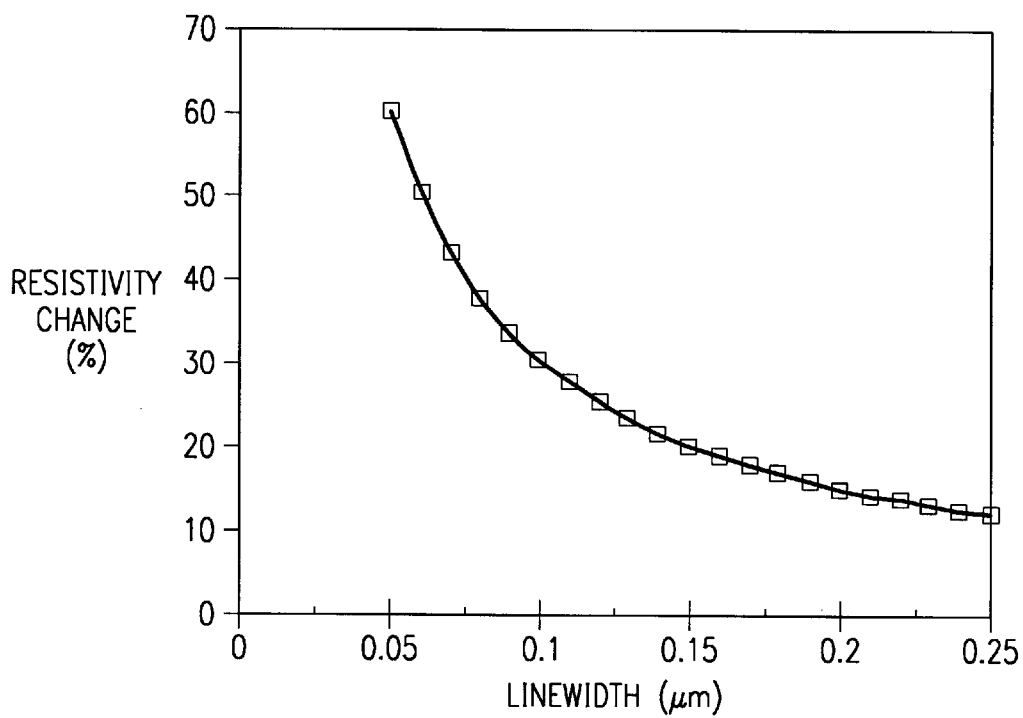
FIG. 2 is a graph of maximum % resistivity change due to sidewall roughness versus copper linewidth.

One major cause of increased copper resistivity in a narrow trench is electron scattering from the sidewalls. Electron mean free path in copper is around 400 Å. When the narrow copper linewidth becomes comparable to the electron mean free path, the effect of electron scattering from the sidewalls becomes significant. FIG. 2 illustrates in theory the resistivity increase in percentage of copper line with very rough sidewalls compared to copper lines with perfectly smooth sidewalls. The contribution of sidewall scattering to copper resistivity becomes more and more when the copper linewidth decreases. The contribution from sidewall scattering can be as high as 30% for a 0.1 $\mu$m linewidth. The sidewall roughness has to be controlled in order to keep the overall copper resistivity low.

The sidewalls of the trench and via are rough after the trench and via etches and ashes. The problem will become more severe when some low k dielectric materials are used. The rough sidewalls promote electron scattering. Electron scattering results in high resistivity. Therefore, it is desirable to repair the rough sidewalls to make them smooth before copper is deposited in the trenches and vias.

The embodiments of the invention described below repair the rough sidewalls by depositing a thin layer of liner material. The embodiments are described in conjunction with a dual damascene process. It will be apparent to those of ordinary skill in the art having reference to the specification that the benefits of the invention may be applied generally to forming narrow copper lines.

The first embodiment of the invention will now be discussed with reference to FIGS. 3A–3D. A semiconductor body 100 is processed through formation of trench 108 and vias 106. Semiconductor body 100 typically comprises a silicon substrate having transistors and other elements formed therein.

An interlevel dielectric (ILD) 102 is formed over semiconductor body 100. IMD (intrametal dielectric) 104 is formed over ILD 102. An etchstop layer (not shown) may optionally be placed between ILD 102 and IMD 104. Suitable dielectrics for ILD 102 and IMD 104, such as silicon dioxides, fluorine-doped silicate glass (FSG), organo-silicate glass (OSG), hydrogen silesquioxane (HSQ), and/or other low k and porous low k materials, are known in the art. The invention is believed to be especially beneficial for low k and porous low k materials.

Figure 3A:
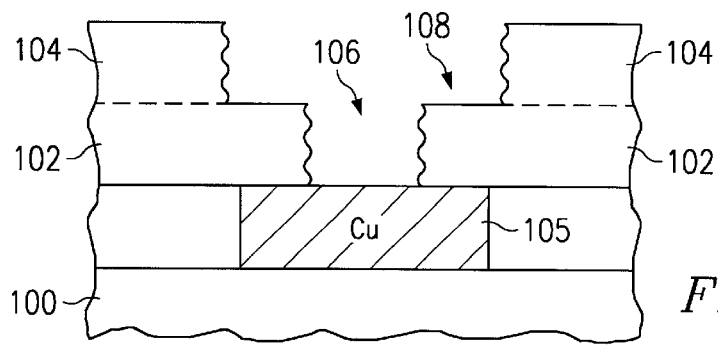
FIGS. 3A–3D are cross-sectional drawings of a copper interconnect structure with sidewall smoothing formed according to a first embodiment of the invention.

A via 106 is etched in ILD 102 and a trench 108 is etched in IMD 104. Via 106 is used to connect to underlying metal interconnect layers, such as copper interconnect 105. Trench 108 is used to form the metal interconnect layer. The via and trench etches and ashes (pattern strips) leave a rough surface on the sidewalls of the via 106 and trench 108, as shown in FIG. 3A.

Figure 3B:
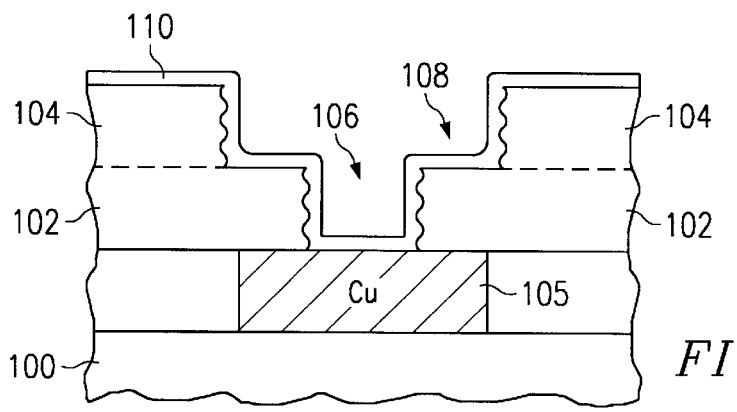

A thin dielectric liner 110 is deposited over IMD 104 and ILD 102 including on the sidewalls of via 106 and trench 108, as shown in FIG. 3B. The size of trench 108 and via 106 may need to be adjusted to account for the thickness of dielectric liner 110. The thickness of thin dielectric liner 110 is in the range of 5–100 Å. Liner 110 may comprise either an organic dielectric or inorganic dielectric. For example, liner 110 may comprise silicon dioxide or suitable low k dielectric materials. Various deposition methods such as chemical vapor deposition (CVD), atomic layer CVD (ALCVD), physical vapor deposition (PVD), or spin-on may be used.

Figure 3C:
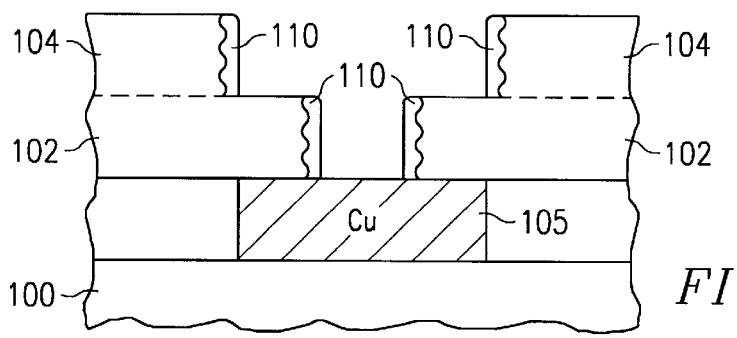

Referring to FIG. 3C, a directional etch is performed to remove portions of dielectric liner 110 located at the bottom of via 106 to open the via to the underneath metal, 105, while leaving the sidewalls intact. Some roughening at the bottom of trench 108 may occur during the directional etch.

However, this is not expected to significantly increase resistivity. An etch that is highly selective to the underneath dielectric 104 is desired. Dielectric liner 110 provides a smooth sidewall on the trench 108 and via 106.

Figure 3D:
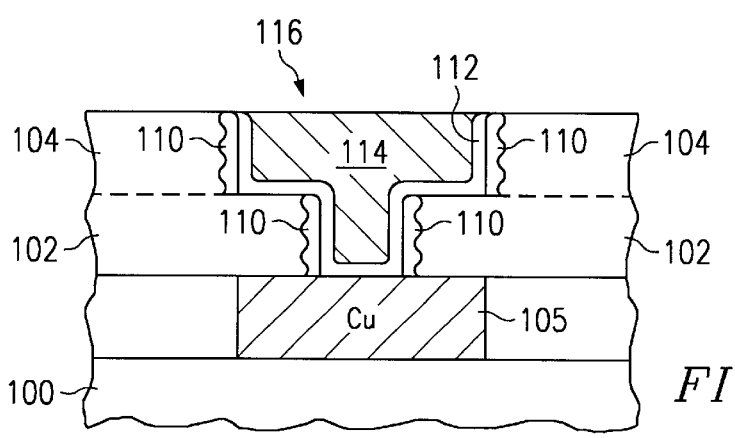

After the directional etch, processing may continue with standard barrier 112 and seed deposition, copper fill 114, and chemical mechanical polish to form copper interconnect 116. The resulting copper interconnect structure 116 is shown in FIG. 3D.

The second embodiment of the invention will now be discussed with reference to FIGS. 4A–4D. As in the first embodiment, semiconductor body 100 is processed through formation of trench 108 and vias 106. Semiconductor body 100 typically comprises a silicon substrate having transistors and other elements formed therein.

An interlevel dielectric (ILD) 102 is formed over semiconductor body 100. IMD (intrametal dielectric) 104 is formed over ILD 102. An etchstop layer (not shown) may optionally be placed between ILD 102 and IMD 104. Suitable dielectrics for ILD 102 and IMD 104, such as silicon dioxides, low-k and porous low-k materials are known in the art.

Figure 4A:
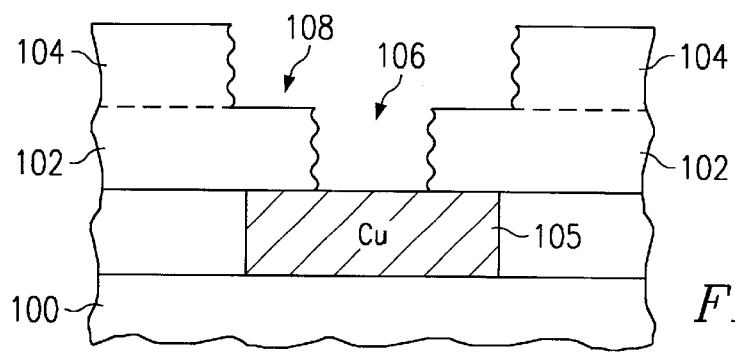
FIGS. 4A–4D are cross-sectional drawings of a copper interconnect structure with sidewall smoothing formed according to a second embodiment of the invention.

A via 106 is etched in ILD 102 and a trench 108 is etched in IMD 104. Via 106 is used to connect to underlying metal interconnect layers, such as copper interconnect 105. Trench 108 is used to form the metal interconnect layer. The via and trench etches and ashes (pattern strips) leave a rough surface on the sidewalls of the via 106 and trench 108, as shown in FIG. 4A.

Figure 4B:
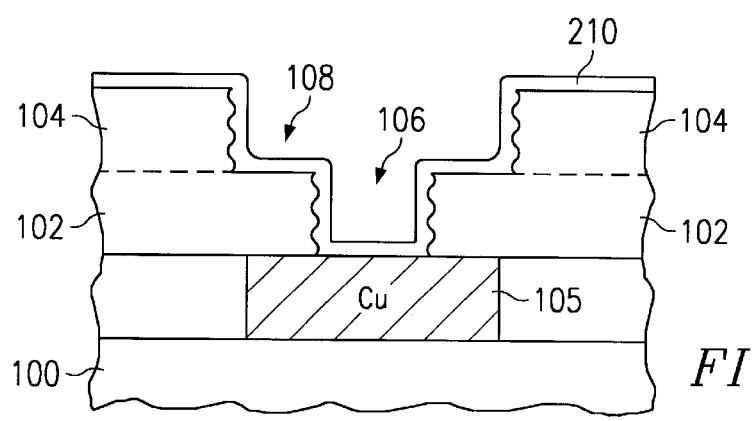

A thin metal liner 210 is deposited over IMD 104 and ILD 102 including on the sidewalls of via 106 and trench 108, as shown in FIG. 4B. The size of trench 108 and via 106 may need to be adjusted to account for the thickness of metal liner 210. The thickness of thin metal liner 210 is in the range of 5–100 Å. Suitable materials include: Ti, TiN, Ta, TaN, WN, WC, TiSiN, TaSiN, etc. Various deposition methods such as CVD, ALCVD, and PVD may be used.

Figure 4C:
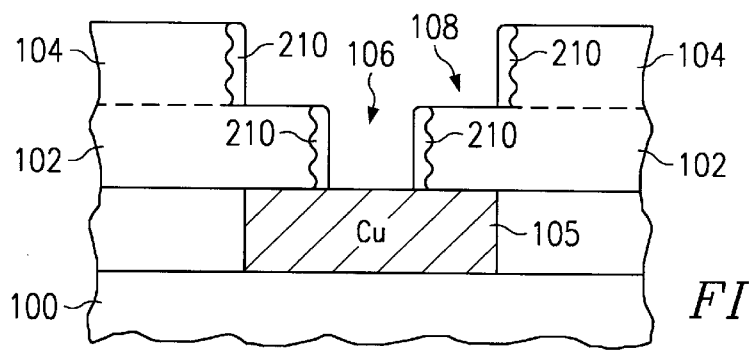

Referring to FIG. 4C, a directional etch is performed to remove portions of metal liner 210 located on the horizontal surface, while leaving the sidewalls intact. Some roughening at the bottom of trench 108 may occur during the directional etch. However, this is not expected to significantly increase resistivity. Good etch selectivity to the underneath dielectric 104 is desired. Metal liner 210 provides a smooth sidewall on the trench 108 and via 106. Due to the smooth sidewalls, a similar reduction in resistivity to that of the first embodiment is expected.

Figure 4D:
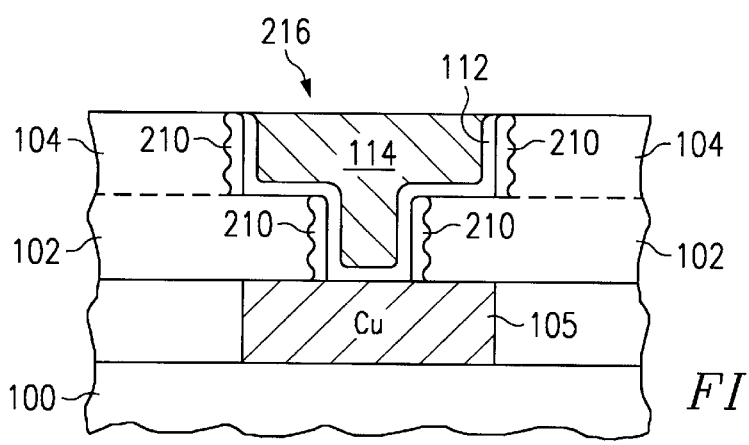

After the directional etch, processing may continue with standard barrier 112 and seed deposition, copper fill 114, and chemical mechanical polish to form copper interconnect 216. The resulting copper interconnect structure 216 is shown in FIG. 4D.

The third embodiment of the invention will now be discussed with reference to FIGS. 5A–5D. As in the first embodiments, semiconductor body 100 is processed through formation of trench 108 and vias 106. Semiconductor body 100 typically comprises a silicon substrate having transistors and other elements formed therein.

An interlevel.dielectric (ILD) 102 is formed over semiconductor body 100. IMD (intrametal dielectric) 104 is formed over ILD 102. An etchstop layer (not shown) may optionally be placed between ILD 102 and IMD 104. Suitable dielectrics for ILD 102 and IMD 104, such as silicon dioxides, fluorine-doped silicate glass (FSG), organo-silicate glass (OSG), hydrogen silesquioxane (HSQ), and/or other low k and porous low-k materials are known in the art.

Figure 5A:
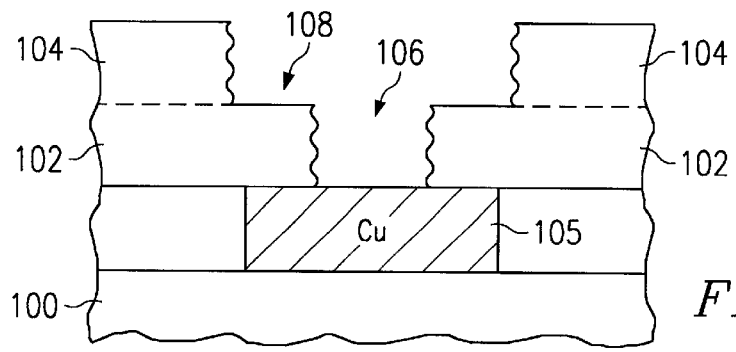
FIGS. 5A–5D are cross-sectional drawings of a copper interconnect structure with sidewall smoothing formed according to a third embodiment of the invention.

A via 106 is etched in ILD 102 and a trench 108 is etched in IMD 104. Via 106 is used to connect to underlying metal interconnect layers, such as copper interconnect 105. Trench 108 is used to form the metal interconnect layer. The via and trench etches and ashes (pattern strips) leave a rough surface on the sidewalls of the via 106 and trench 108, as shown in FIG. 5A.

Figure 5B:
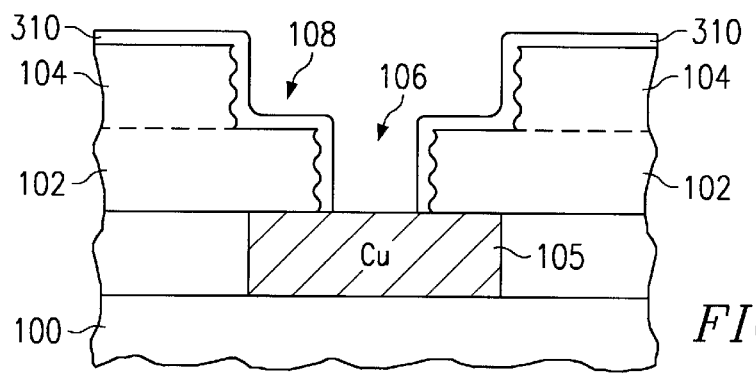

A thin metal liner 310 is deposited over IMD 104 and ILD 102 including on the sidewalls of via 106 and trench 108, as shown in FIG. 5B. The size of trench 108 and via 106 may need to be adjusted to account for the thickness of metal liner 110. The thickness of thin metal liner 110 is in the range of 5–100 Å. Suitable materials include: Ti, TiN, Ta, TaN, WN, WC, TiSiN, TaSiN, etc. Various deposition methods such as CVD, ALCVD, and PVD may be used.

In this embodiment, a directional etch is not performed. The excess liner material on IMD 104 is removed during the subsequent copper CMP process. Metal liner 310 provides a smooth sidewall on the trench 108 and via 106.

Figure 5C:
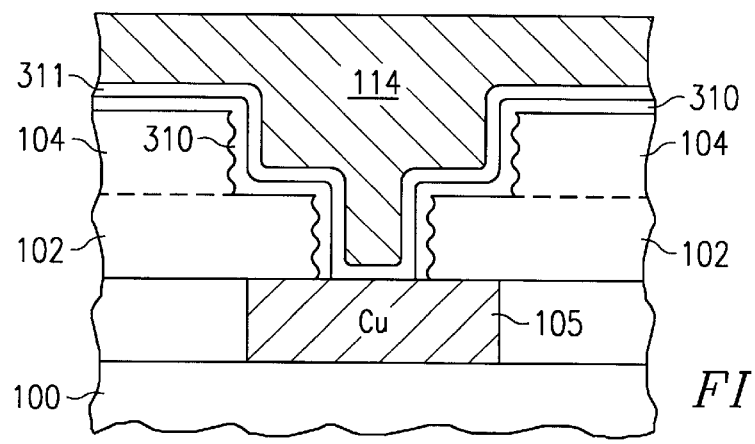
Figure 5D:
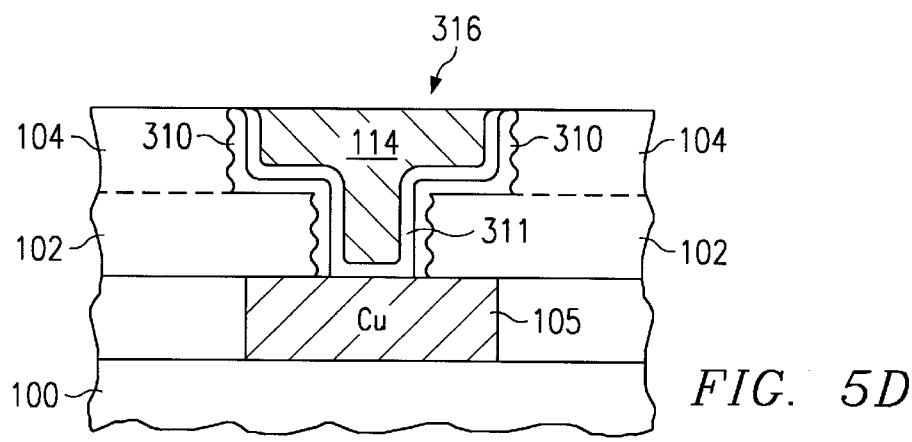

Processing may then continue with standard barrier 311 and seed deposition. However, if metal liner 310 can also satisfy the copper barrier criteria (good copper diffusion blocking efficiency, good adhesion, low resistivity, etc), the additional barrier layer may be omitted. Trench 108 and via 104 are then filled with copper by, for example, an electro-chemical deposition (ECD) process, as shown in FIG. 5C. Chemical-mechanical polishing is then used to remove the excess copper fill 114, barrier 311 and metal liner 310 from the above the top surface of IMD 104, resulting in copper interconnect 316. The resulting copper interconnect structure 316 is shown in FIG. 5D. In the third embodiment, the metal barrier layer and the metal liner layer can be switched if better smoothness, adhesion, convenience, etc. can be achieved. It means if necessary, the barrier layer can be deposited first followed by the metal liner and Cu fill.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method of fabricating an integrated circuit, comprising the steps of:

forming a dielectric layer over a semiconductor body;

etching a hole in said dielectric layer, wherein sidewalls of said hole have a rough surface;

depositing a thin liner over said dielectric layer including within said hole, wherein a surface of said thin liner within said hole has a smoother surface than said rough surface and wherein said thin liner comprises an organic dielectric;

depositing a barrier layer over said thin liner;

forming a copper interconnect structure in said hole after the steps of depositing the thin liner and depositing the barrier layer.

2. The method of claim 1, further comprising the step of directionally etching said thin liner leaving sidewalls of said thin liner intact.

3. The method of claim 1, wherein said hole comprises a trench.

4. The method of claim 1, wherein said bole comprises a trench and a via.

5. The method of claim 1, wherein said thin liner has a thickness in the range of 5–100 Å.

6. A method of fabricating an integrated circuit, comprising the steps of:

forming a interlevel dielectric layer over a semiconductor body;

forming an intrametal dielectric layer over said interlevel dielectric layer;

etching a trench in said intrametal dielectric layer and a via in said interlevel dielectric layer;

depositing a thin liner over said intrametal dielectric layer including within said trench and said via, wherein said thin liner provides a smoother surface to said trench and via;

directionally etching said thin liner in a horizontal direction to remove said thin liner from a bottom of said via;

depositing a barrier layer over said thin liner;

forming a copper interconnect structure in said trench and said via after the steps of depositing the thin liner and depositing the barrier layer.

7. The method of claim 6, wherein said thin liner comprises an organic dielectric.

8. The method of claim 6, wherein said liner comprises an inorganic dielectric.

9. The method of claim 6, wherein said liner comprises silicon dioxide.

10. The method of claim 1, wherein said thin liner has a thickness in the range of 5–100 Å.

11. A method of fabricating an integrated circuit, comprising the steps of:

forming a dielectric layer over a semiconductor body;

etching a hole in said dielectric layer, wherein sidewalls of said hole have a rough surface;

depositing a thin liner over said dielectric including within said hole, wherein a surface of said thin liner within said hole has a smother surface than said rough surface and wherein said thin liner comprises silicon dioxide;

depositing a barrier liner over said thin liner;

forming a copper interconnect structure In said hole after the steps of depositing the thin liner and depositing the barrier layer.

* * * * *